(12) United States Patent
Starlinger-Huemer et al.

(10) Patent No.: US 6,533,104 B1
(45) Date of Patent: Mar. 18, 2003

(54) DEVICE FOR RECEIVING AND TRANSPORTING OBJECTS

(75) Inventors: Franz Starlinger-Huemer, Vienna (AT); Gerhard Apfler, Pernitz (AT)

(73) Assignee: Starlinger & Co. Gesellschaft m.b.H., Vienna (AT)

( * ) Notice: Subject to any disclaimer, the term of this patent is extended or adjusted under 35 U.S.C. 154(b) by 0 days.

(21) Appl. No.: 09/806,965

(22) PCT Filed: Oct. 4, 1999

(86) PCT No.: PCT/AT99/00234

§ 371 (c)(1),
(2), (4) Date: Apr. 4, 2001

(87) PCT Pub. No.: WO00/20304

PCT Pub. Date: Apr. 13, 2000

(30) Foreign Application Priority Data

Oct. 5, 1998 (AT) .............................................. 1656/98

(51) Int. Cl.[7] .............................................. B65G 15/12
(52) U.S. Cl. .................. 198/626.1; 198/606; 198/626.5
(58) Field of Search .............................. 198/606, 626.1, 198/626.4, 626.5

(56) References Cited

U.S. PATENT DOCUMENTS

| | | | | |
|---|---|---|---|---|
| 1,487,601 A | * | 3/1924 | Priem ...................... | 198/626.1 |
| 2,303,587 A | * | 12/1942 | Synder ..................... | 198/626.1 |
| 2,961,020 A | * | 11/1960 | Minami .................... | 198/626.1 |
| 3,454,142 A | * | 7/1969 | Holstein ................... | 198/626.1 |
| 4,798,281 A | * | 1/1989 | Egger ........................ | 198/698 |
| 5,029,696 A | * | 7/1991 | Van Tilburg ............. | 198/626.1 |
| 5,657,615 A | * | 8/1997 | Muller ..................... | 198/626.5 |
| 6,179,115 B1 | * | 1/2001 | De Guglielmo et al. . | 198/626.1 |
| 6,260,690 B1 | * | 7/2001 | Batzer ..................... | 198/626.5 |
| 6,296,107 B1 | * | 10/2001 | Baumgartner-Pichelsberger ........... | 198/626.5 |

* cited by examiner

Primary Examiner—Douglas Hess
(74) Attorney, Agent, or Firm—Townsend and Townsend and Crew LLP

(57) ABSTRACT

A device for receiving and transporting objects has at least one pair of parallel chains or belts situated opposite each other and driven in synchrony, which define a space between each other for transporting the objects therethrough. Each chain has at least one gripper which is mounted so as to be pivotable thereon and faces a corresponding gripper on the other chain. Each gripper has an extension which is moveable along a guiding path. The guiding path has a path section sloped with respect to the direction of transport of the objects at the point of receipt of the objects, so that, when the chain is moving, the extension of the gripper is deflected along the sloped path section and thus a rotational movement countering the translational movement caused by the chain is imparted to the gripper. Thus no rotational movement occurs at the moment of contact between the gripper and the object.

13 Claims, 2 Drawing Sheets

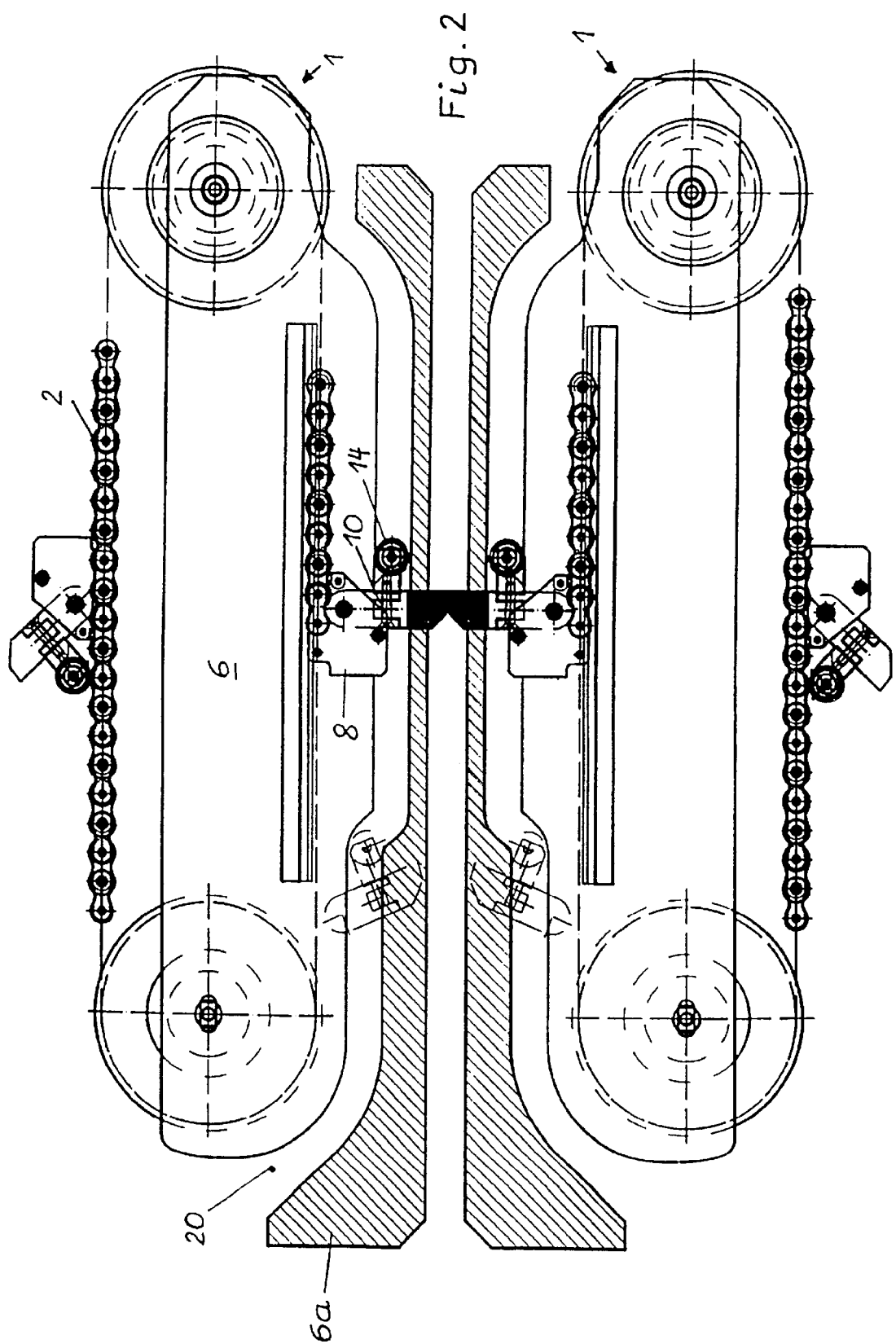

DEVICE FOR RECEIVING AND TRANSPORTING OBJECTS

BACKGROUND OF THE INVENTION

The present invention relates to a device for receiving and transporting objects, preferably objects of flat shape, the device having at least one pair of parallel chains or belts situated opposite each other and driven in synchrony, which define a space between each other for transporting the objects therethrough, each chain or belt having at least one gripper and each gripper of a chain or belt facing a respective gripper of the other chain or belt, each gripper being mounted on the chain or belt so as to be pivotable about a pivot axis oriented transversely to the direction of movement of the chain or belt, each gripper having an extension in spaced relationship to the pivot axis, which extension may be moved along a guiding path of a guiding plate, each chain or belt being associated with a guiding path, and the respective guiding path having a path section sloped with respect to the conveying direction of the objects at the point where the objects are received, so that, when the chain or belt is moving, the extension of the gripper is deflected along the sloped path section and thus the gripper is imparted a rotational movement which counteracts the translational movement caused by the chain or belt.

DE 31 46 931 A1 discloses such a device intended for feeding bar material. There an endless driving traction member is arranged on a frame, which member carries a plurality of clamps for the bar material at its periphery, which clamps cooperate with guiding plates fixed on the frame while they are moving. Each clamp consists of a pair of double-arm levers arranged so as to be rotatable in a horizontal plane and spring-loaded in the direction opposite the direction of movement of the endless traction member. Self-locking profiles eccentric with respect to their rotational axes are formed on the lever arms facing each other and cooperate with the bar material during movement of the traction member; the opposing arms of the levers are adapted for cooperation with the guiding plates. However, because of the straight portions of the guiding plates the relative speed between the clamps and the bar material is not zero, which makes exact machining impossible and results in low processing speed.

DE 30 38 425 A1 teaches a device for conveying objects of flat shape (insulating glass panes), wherein the objects are held and conveyed by grippers arranged on conveying chains.

Furthermore, industrial production often encounters the problem that in the course of an automatic manufacturing operation objects transported along a transporting distance have to be stopped in order to subject them to a processing step. After this processing step has been completed the objects again have to be received by the transporting system and moved on to the next processing station.

A practical example for the above production operation can be found in the production of sacks. In the course of this, tubular material webs are continuously fed into a sack manufacturing installation from a drum. This continuous movement of the material webs has to be converted into an intermittent movement so that sack bodies of appropriate length may be cut off. The sack bodies lying still are then transported to further processing stations, like a sewing machine, a sack bottom folding and closing machine and a printing machine. In the course of this manufacturing process it will be necessary again and again to bring the sack body to a halt and to move it on again, changes of direction sometimes being necessary as well.

Two basic types of devices for receiving objects in a transport system and conveying them are known in the art. The first type is that of a discontinuously operating conveying belt. Here the object to be transported is clamped to the belt by suitable means while the belt is not moving, the belt subsequently being accelerated. In case of the production of sacks the sack body is conveniently attached to the belt by vacuum.

The fundamental disadvantage of this type is the stop-and-go operation, resulting in high wear of the individual components, high energy consumption and thus high operation expenses. Such a device requires frequent maintenance, and in addition is rather imprecise in its operation, which in case of the manufacturing of sacks results in high rejection rates, as exact positioning of the sack body, for instance at the sewing machine or the printing machine, is indispensable.

The second known type of a device for receiving and transporting objects is that with continuously moving arms, gripping the object with gripping claws and preferably transmitting it to a conveying belt. Thus in the case of the production of sacks it is not necessary to move significant masses, which results in less energy consumption of the device. What is required, however, is sophisticated electronic control, and because of the inevitable component and fitting tolerances, as well as because of wear, this machine has to be readjusted quite frequently. The throughput rates of several dozen sacks per minute, which are typical for the production of sacks, make it necessary for the gripping claws to engage a sack body in coordinated fashion within a fraction of a second, which is difficult to achieve and thus frequently results in the sack body being pulled into the conveying system at an angle, which in turn results in high rejection rates.

Thus it would be desirable to be able to provide a device for receiving and transporting objects, in particular objects of flat shape, as for instance sack bodies, which is reliable, works highly accurately, hardly needs any maintenance and readjustment, and in addition permits high processing speeds.

SUMMARY OF THE INVENTION

This aim is achieved according to the present invention by developing a device of the above kind in such a way that the sloped path section of the guiding path of each guiding plate is curved at the point of receipt. As a result, that component of the circular speed given to the engagement end of the gripper which is directed against the transportation speed of the objects is not constant but subject to acceleration, bringing the relative movement between the grippers engagement end and the object close to zero at the time of receipt.

This device according to the invention is very reliable as it comprises no parts which would require complicated adjustment or tend to be misadjusted during operation. The guiding plates may be made of massive metal plates, so that wear of the guiding paths by the sliding movement of the extensions of the grippers is negligible. As the guiding plates are fixedly mounted on the device, the position of the guiding paths always remains the same. In order to transport objects of a different size the guiding plates are simply exchanged. Thus the device may be operated by personnel without much training, which greatly reduces the operation expenses. As compared to a translational movement directed towards the object to be gripped, the rotational movement carried out by the grippers has the major advantage that, as seen in direction of transportation, the relative movement between the engagement end of the grippers and the object approaches zero at the time of receipt, ensuring synchronous gripping by the grippers even at high transportation speeds.

In order to ensure uniform force of engagement by the grippers all along the distance of transportation of the objects the guiding path of the respective guiding plate runs parallel to the direction of transportation of the objects after the point of receipt.

At a point where the objects are discharged the guiding path of the respective guiding plate conveniently has a (preferably curved) path section sloped in opposite direction to the inclination of the guiding path at the point of receipt.

According to one embodiment of the invention the grippers are mounted in bearing shoes on the chain or belt.

In order to make the distance to be travelled by the grippers for gripping the objects at the point of receipt as short as possible, the guiding path of each guiding plate runs at a distance to the chain or belt in a feeding zone upstream of the point of receipt, where the respective gripper is pre-deflected close to the object by its extension.

Conveniently the grippers are biased to an inoperative position by spring means, where an engagement end of the gripper is at a distance from the object to be received.

A favorable embodiment of the invention is characterized in that the extension of each gripper may be moved along between two preferably nearly parallel guiding paths facing each other. Thus the gripper may be deflected towards the object as well as away therefrom, the deflection forces exerted on the gripper being much higher than the restoring forces exerted by the spring means, it being possible, however, to additionally use spring means in order to bias the grippers to a defined position outside the guiding paths, i.e. where the chain is returning.

In order to improve gripping of the objects the grippers advantageously have engagement jaws of elastomeric material.

In order to minimize friction between the extension for deflecting the gripper and the guiding path of the guiding plate, the extension may be provided with a freely rotatable roller.

In order to achieve a desired leverage the extension for deflecting the gripper is positioned on a cantilevered arm of the gripper.

In order to prevent the chain or belt from sagging along the transportation distance of the objects, which would result in reduced engagement force of the grippers, a support structure may be provided close to the chain or belt, where the chain or belt and the bearing shoe, respectively, of the grippers may rest.

The invention will now be explained in more detail by way of example with reference to the attached drawings.

BRIEF DESCRIPTION OF THE DRAWINGS

FIG. 2 shows a diagrammatic side view of a second embodiment of the device according to the invention.

DESCRIPTION OF THE PREFERRED EMBODIMENTS

Figure 1:
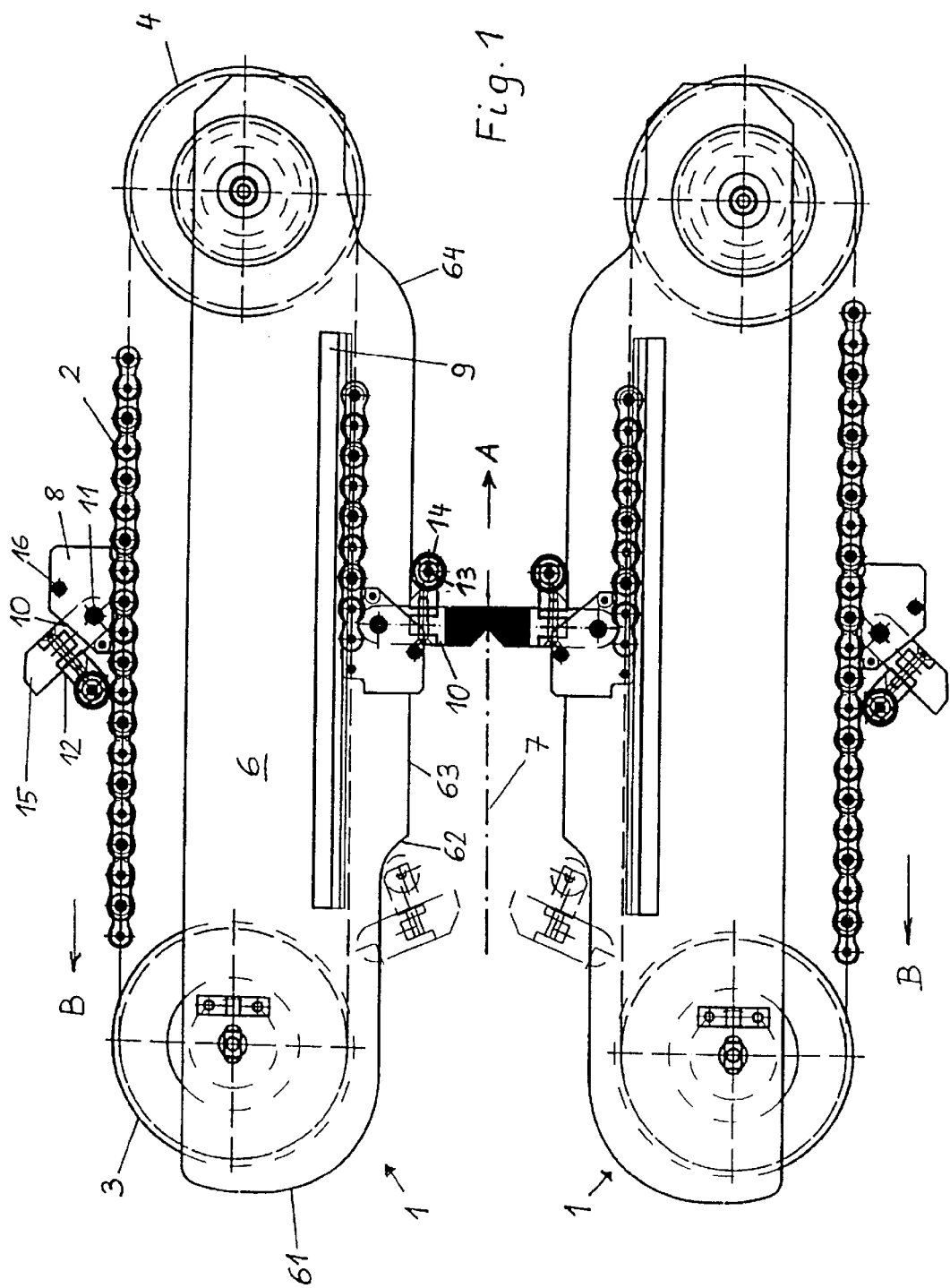
FIG. 1 shows a diagrammatic side view of a first embodiment of a device according to the invention.

FIG. 1 shows a diagrammatic side view of a device according to the invention for receiving and transporting objects. It comprises two systems 1,1 of revolving chains, arranged so as to be mirror-inverted and driven synchronously in opposite directions of rotation (see arrow B). As the two systems form mirror images of each other, description and designation by reference numerals may be restricted to one system, while applying, mutatis mutandis, to the second system as well.

Two gearwheels 3, 4 are rotatably mounted on a machine body (not shown), at least one of them being rotated by a drive which is not shown. A chain 2 runs around the gearwheels in the direction shown by arrow B. Two grippers 10 are pivotably mounted on chain 2 at equal distance from each other. Each gripper is fixed to the chain by a respective bearing shoe 8, which is fixedly mounted on the chain and has a pivot axis 11 running transversely to the longitudinal extension of the chain, on which pivot axis gripper 10 is pivotably mounted. Pivotal movement of the gripper is limited by a pin 16 at one side. The gripper may be biased to a pre-defined position of rest by a spring (not shown). Each gripper has an engagement jaw 15 of suitable material, in particular elastomeric material, at its free engagement end opposing the pivot axis bearing. An arm 12 protrudes from the gripper at about a right angle to the longitudinal direction of the gripper 10 and spaced apart from the pivot axis, which arm in turn has an extension 13 running transversely to the direction of movement B of the chain. In the illustration of FIG. 1, this extension 13 extends out of the plane of the drawing. Extension 13 forms a rotational axis for a rotatable roller 14.

The two systems 1,1 are arranged so as to face each other and be spaced apart from each other, so that an object, in the case illustrated a sack body 7, may be transported therethrough in the direction of arrow A. For this purpose the sack body has to be gripped by a respective gripper of each system at a point of receipt, then held and pulled on along a conveying distance, to be finally released by the grippers at a point of discharge. For this purpose one guiding plate 6 for each system 1,1 is mounted on the machine body (not shown), that side edge thereof which faces the respective opposing system 1 offering a guiding path, on which the roller 14 of extension 13 of each gripper 10 rests during its movement in the direction of transport (arrow A), and along which it is moved in movement forcedly guided at the one side and driven by chain 2. The guiding path of guiding plate 6 consists of a feeding section 61, where the roller 14 of a gripper 10, when the latter has finished its return movement from gearwheel 4 to gearwheel 3 and begins its forward movement, touches down on the guiding path and is pre-deflected in an arcuate movement with respect to the chain. The arcuate movement of roller 14 with respect to the chain 2 results from gripper 10 connected to roller 14 via lever arm 12 being turned about its pivot axis 11 when the roller is deflected, which brings the gripper from its rest position to a position where it is only a short normal distance away from the sack body 7 to be received subsequently. The feeding section 61 is followed by a section 62 curved away from the chain starting from the defined point of receipt of the sack body 7. This curvature of the guiding path imparts an increasingly accelerated circular movement to a roller 14 of a gripper moving along this section, and thus also to the associated gripper 10 and in particular its engagement jaw 15, the circular movement counteracting the translational movement (arrow A) of chain 2. This condition of a gripper being in section 62 of the guiding path is shown in phantom in the drawing. Comparison with a gripper in rest position shows that in the illustration it has already been rotated against translational movement from its rest position towards the sack body 7 to be received. Curvature of the guiding path of the guiding plate is such that at the moment of contact between the sack body 7 lying still and the engagement jaw 15 of the gripper, the translational movement and the circular movement of the engagement jaw in the opposite direction substantially counterbalance each other, and thus there is practically no relative movement between the sack body and the engagement jaw. Only after the sack body has been gripped by the gripper does the roller 14 of the gripper progress to a straight section 63 of the guiding path, which is at a constant distance from chain 2, so that the gripper is no longer subject to rotational movement and thus the translational movement of chain 2 again is transmitted to the gripper and consequently acts on the sack body clamped between grippers facing each other.

As mentioned above, the object, i.e. sack body 7, is clamped between grippers of opposing systems 1, 1. Because (1) the chains of both systems move at the same speed, (2) the grippers are arranged on the chains in such a way that a respective gripper of one system faces a respective gripper of the other system, (3) and the guiding paths of the guiding plates form mirror images of each other, it is ensured that the object is gripped and pulled along by grippers on opposing sides at the same time. Problems with synchronization as encountered with the prior art do not occur, nor are readjustments of the systems necessary.

Depending on the size of the object to be transported and its nature it may be necessary to hold it between several pairs of grippers. For this purpose several similar pairs of systems 1, 1 are arranged in parallel side by side, and the positions of all their grippers are harmonized. In the example for transporting sack bodies shown in FIG. 1 two pairs of systems are normally used, so that each sack body is gripped at two points at the same time. However, the drawing only shows the system pair 1, 1 in front, as the second one is exactly behind it as seen from the viewer. As the relative speed between gripper and object is practically zero at the time of receipt, it is also conceivable for heavy objects to be gripped not only at their front end, but in addition also at their rear end. For this purpose it is only necessary to adjust the distance between the grippers on one chain so that it is shorter than the length of the object.

After the sack body has been received it is transported at a speed determined by the speed of the chain as long as the gripper is in section 63 of the guiding path. In order to prevent the inevitable sag of the chain 2 between the gearwheels 3, 4 from resulting in a reduction of clamping force of the grippers, a support beam 9 having a low-friction surface is provided close to the chain and parallel thereto, on which the bearing shoe 8 may rest during transportation of the sack body.

At the defined point of discharge of the sack body the guiding path of guiding plate 6 again has a curved section 64, which is, however, sloped towards the chain, so that the guiding plate no longer applies any force on roller 14 of gripper 10 which would press the gripper against the sack body. Instead, the gripper is urged toward its rest position by the restoring force of a spring in bearing shoe 8, and the sack body is released. The sack body is now lying still and may be submitted to a further processing step.

FIG. 2 shows a variant of the first embodiment of the device according to the invention which differs from the embodiment shown in FIG. 1 only in that in addition to guiding plate 6 a further guiding plate 6a is used for each system 1, 1, the side edge forming a guiding path which faces the guiding path formed by guiding plate 6. The guiding paths of both guiding plates run nearly parallel to each other at a distance which is somewhat larger than the diameter of roller 14 of gripper 10 and form a channel 20, through which roller 14 moves along in movement guided on both sides. In other words, during movement of the gripper with chain 2 along the transporting distance of the sack body, the roller 14 associated with the gripper is forcedly guided in the channel, and in addition to the translational movement caused by the chain carries out a pivotal movement away from the chain or towards it, depending on the course of channel 20. With this embodiment no spring in the bearing shoe is necessary in order to prompt the gripper to release the sack body at the point of discharge; instead, this function is fulfilled by guiding plate 6a. Nevertheless a spring in bearing shoe 8 may be convenient in order to bias the gripper to a rest position during its return to the point of receipt, the spring then being dimensioned substantially smaller than in the first embodiment. As an alternative, the gripper may also be held in a defined rest position by means of a guiding plate during its return.

What is claimed is:

1. A device for receiving and transporting objects, comprising:
   a pair of parallel carriers situated opposite each other and adapted to be driven in synchrony, the pair of parallel carriers defining a transport path between them along which an object is transportable from a point of receipt to a point of release;
   a pair of grippers, each coupled to a respective one of the pair of parallel carriers and disposed opposite the other of the pair of grippers, each gripper being rotationally movable about a pivot axis toward the other gripper, thereby enabling the pair of grippers to grip and hold an object to be transported, each gripper having a respective guide assembly fixed thereto, the guide assembly adapted to control a rotational motion of the gripper about the pivot axis; and
   a pair of first guide elements, each disposed along at least a portion of a length of a respective one of the pair of parallel carriers and defining a first guide path for guiding the guide assembly of the respective one of the pair of grippers and imparting a rotational motion to the gripper, each first guide path including a first sloped path section adapted to impart a rotational motion to the gripper such that at a moment of initial contact between the gripper and an object to be transported, the rotational motion of the gripper and the translational motion of the gripper substantially counterbalance each other.

2. The device according to claim 1, wherein each of the first guide paths further includes a straight path section running substantially parallel to the transport path.

3. The device according to claim 1, wherein each of the first guide paths further includes a second sloped path section, the second sloped path section imparting a rotational motion to the gripper about its pivot axis in a direction opposite a direction of the rotational motion imparted by the first sloped path section.

4. The device according to claim 1, wherein each of the first guide paths further includes a feeding zone upstream of the point of receipt, the feeding zone pre-deflecting an engagement end of the gripper close to a location of an object to be transported.

5. The device according to claim 1, further comprising:
   at least two bearing shoes, each attached to a respective one of the pair of parallel carriers, wherein each gripper is pivotably mounted in a respective one of the bearing shoes.

6. The device according to claim 1, further comprising:

spring means coupled to each of the grippers and adapted to bias the gripper into a rest position, wherein in the rest position, an engagement end of the gripper is at a distance from an object to be transported.

7. The device according to claim 1, further comprising:

a pair of second guide elements each disposed so as to face a respective one of the first guide elements and to guide the guide assembly of the respective one of the pair of grippers along a second guide path.

8. The device according to claim 7, wherein each second guide path is substantially parallel to the respective one of the first guide paths.

9. The device according to claim 1, wherein each gripper has an engagement jaw comprising an elastomeric material.

10. The device according to claim 1, wherein each guide assembly includes a freely rotatable roller adapted to roll along the first guide path.

11. The device according to claim 1, wherein each guide assembly is arranged on a cantilevered arm of the gripper.

12. The device according to claim 1, wherein each carrier includes a chain or belt.

13. The device according to claim 12, further comprising:

a support structure disposed along a portion of the chain or belt facing the transport path and adapted to prevent the chain or belt from sagging away from the transport path.

* * * * *